United States Patent [19]

Takao

[11] Patent Number: 5,408,691
[45] Date of Patent: Apr. 18, 1995

[54] RADIO TRANSMITTER APPARATUS WHICH OPTIMIZES LOAD IMPEDANCE TO MAXIMIZE OUTPUT TRANSMITTER EFFICIENCY WHILE PRESERVING MINIMUM BATTERY POWER OUTPUT

[75] Inventor: Nobutaka Takao, Kanagawa, Japan

[73] Assignee: Sony Corporation, Japan

[21] Appl. No.: 143,523

[22] Filed: Oct. 26, 1993

Related U.S. Application Data

[63] Continuation of Ser. No. 704,123, May 22, 1991, abandoned.

[30] Foreign Application Priority Data

Jun. 1, 1990 [JP] Japan .................................. 2-144881

[51] Int. Cl.⁶ ............................................ H04B 1/04
[52] U.S. Cl. ...................................... 455/127; 455/99; 455/107; 455/129
[58] Field of Search .................. 455/89, 115, 117, 120, 455/123, 125–127, 129, 248, 343, 107, 95, 96, 99; 330/302

[56] References Cited

U.S. PATENT DOCUMENTS

| | | | |
|---|---|---|---|
| 4,313,060 | 1/1982 | Fickenscher et al. | 307/23 |
| 4,323,788 | 4/1982 | Smith | 307/66 |
| 4,401,894 | 8/1983 | Weisner | 307/64 |
| 4,439,741 | 3/1984 | Turner, Jr. | 455/63 |
| 4,612,669 | 9/1986 | Nossen | 455/123 |
| 4,636,741 | 1/1987 | Mitzlaff | 455/99 X |
| 4,709,403 | 11/1987 | Kikuchi | 455/117 |
| 4,985,686 | 1/1991 | Davidson | 455/123 |
| 5,023,569 | 6/1991 | Raven | 330/302 |
| 5,033,109 | 7/1991 | Kawano et al. | 455/90 |
| 5,276,912 | 1/1994 | Siwiak et al. | 455/73 |

FOREIGN PATENT DOCUMENTS

| | | | |
|---|---|---|---|
| 0280409A1 | 8/1988 | European Pat. Off. | H02J 7/00 |
| 2659673 | 7/1978 | Germany | 455/127 |
| 2167869 | 6/1986 | United Kingdom | G01R 31/36 |
| 2175700 | 12/1986 | United Kingdom | G01R 31/36 |

Primary Examiner—Reinhard J. Eisenzopf
Assistant Examiner—Chi H. Pham
Attorney, Agent, or Firm—Alan S. Hodes; Limbach & Limbach

[57] ABSTRACT

A radio transmitter apparatus arranged such that transmission efficiency is improved by switching the load impedance on the final stage in response to the power source voltage or the transmission output power.

4 Claims, 5 Drawing Sheets

RADIO TRANSMITTER APPARATUS WHICH OPTIMIZES LOAD IMPEDANCE TO MAXIMIZE OUTPUT TRANSMITTER EFFICIENCY WHILE PRESERVING MINIMUM BATTERY POWER OUTPUT

This is a continuation of application Ser. No. 07/704,123 filed on May 22, 1991, now abandoned.

BACKGROUND OF THE INVENTION

1. Field of the Invention

The present invention generally relates to transmitting apparatus and, more particularly, is directed to a radio transmitter apparatus.

2. Description of the Prior Art

In a mobile telephone system, for example, a cellular phone system, the base station controls the transmitter power output of the mobile station according to the transmission distance from the mobile station to the base station to increase telephone subscriber capacity of the phone system.

To enable the transmitter power output to be varied, the transmitter output stage of the mobile station is constructed as shown in, for example, FIG. 1.

In FIG. 1, reference numeral 1 designates the telephone transmitter, 2 the transmitting circuit, 20 the power amplifier fabricated as a module, 3 a strip line, 4 the up-channel bandpass filter, and 5 the transmitting and receiving antenna.

When making an outgoing call, an audio signal from the telephone transmitter 1 is supplied to the transmitting circuit 2, in which it is converted into an FM signal Su at the up channel frequency. This FM signal Su is amplified in power by the power amplifier 20 and supplied through the strip line 3 and the bandpass filter 4 to the antenna 5, from which it is transmitted to the base station.

In FIG. 1, reference numeral 6 designates the down channel bandpass filter, 7 the receiving circuit, and 8 the telephone receiver. Upon reception, an FM signal at the down channel frequency from the base station is received at the antenna 5, and the received FM signal is supplied through the filter 6 to the receiving circuit 7, in which the audio signal is derived. This audio signal is supplied to the telephone receiver 8.

Further, in FIG. 1, reference numeral 9 designates a microcomputer, and the transmitting circuit 2 and the receiving circuit 7, etc. are controlled by the microcomputer 9.

In the power amplifier 20, reference numerals 21 to 23 designate transistors, and the FM signal Su from the transmitting circuit 2 is sequentially supplied to the transistors 21 to 23 and then supplied to the antenna 5. The transistor 21 is operated in class AB mode and the transistors 22 and 23 are operated in class C mode.

Further, a power source voltage +Vcc from a power source terminal 31 is supplied to the circuits 2, 7 and 9 and to the transistors 22 and 23 as an operating voltage.

A voltage dividing circuit 32 is connected between the power source terminal 31 and the ground to derive a plurality of divided voltages V1 to Vn, and these voltages V1 to Vn are supplied to a switching circuit 33. The switching circuit 33 is controlled by the microcomputer 9 and the switching circuit 33 selects a voltage Vi from the voltages V1 to Vn, the voltage Vi being supplied to a voltage comparator 34.

The FM signal Su from the power amplifier 20 is supplied to a detector 35, in which it is converted into a DC voltage Vd of level equal to the level (amplitude) of the FM signal Su. This voltage Vd is supplied to the comparator 34. The output of the comparator 34 is supplied to the transistor 21 as its operating voltage.

Accordingly, the voltage is fed back by the comparator 34 to establish the equality of Vd=Vi, i.e., to make the level of the FM signal Su from the power amplifier 20 equal to the level of the voltage Vi. Thus, the level of the FM signal Su can be controlled by controlling the switching circuit 33 by the microcomputer 9, thereby controlling the transmitter power output (see Published Searched Application Gazette No. 63-501258).

When the mobile station is used while being carried, it is driven by a built-in battery housed therein.

When the mobile station is mounted in an automobile and used, the antenna 5 is changed to the antenna of the automobile and the mobile station is driven by the battery of the automobile.

The built-in battery and the automobile battery are different in voltage and the voltage of the automobile battery is generally higher than that of the built-in battery. Moreover, the transmitter output power of the mobile station is larger when the mobile station is mounted in the automobile than when the mobile station is carried.

In the above transmitting circuit 2, the load impedance from the amplifier 20 to the antenna side is constant, for example, 50 Ω regardless of the level of the transmitter output power. Further, the power amplifier 20 is generally designed so as to provide maximum efficiency at maximum transmitter output power.

Accordingly, when the mobile station is installed on the automobile, the efficiency of the transmitter is maximized, while when the mobile station is carried, the efficiency of the transmitter is lower.

However, the base station demands from the mobile station the output power necessary for telephone communication so that, when the mobile station is carried, the mobile station produces the output power demanded by the base station regardless of the lower efficiency of its transmitter. Thus, the service life of the built-in battery, and hence the available telephone communication time, is unavoidably reduced.

OBJECTS AND SUMMARY OF THE INVENTION

Accordingly, it is an object of the present invention to provide an improved radio transmitter apparatus in which the aforenoted shortcomings and disadvantages of the prior art can be eliminated.

More specifically, it is an object of the present invention to provide a radio transmitter apparatus in which the battery service life, and hence the telephone communication time, is maximized.

It is another object of the present invention to provide a radio transmitter apparatus in which the transmission can be carried out at high efficiency even when the battery voltage is reduced.

According to the first aspect of the present invention, a radio transmitter apparatus providing a signal to an antenna, and having a battery as a power source comprises a power amplifier connected to the battery, a variable impedance circuit between the power amplifier and the antenna, and a detecting circuit for generating a control signal in response to the voltage of the battery. The control signal controls the variable impedance circuit to switch the load impedance of the power amplifier in response to the voltage of the battery.

According to the second aspect of the present invention, a radio transmitter apparatus provides a signal to an antenna, the radio transmitter apparatus having as its power source a battery switchably selected from at least two batteries having different voltages. The radio transmitter apparatus comprises a power amplifier connected to the switchably-selected battery, a variable impedance circuit between the power amplifier and the antenna, and a detecting circuit for generating a control signal in response to the voltage of the switchably-selected battery. The control signal controls the variable impedance circuit to switch the load impedance of the power amplifier in response to the voltage of the switchably-selected battery According to the third aspect of the invention, a radio transmitter apparatus provides a radio-frequency signal to an antenna. The radio transmitter apparatus is powered by a power supply that provides an output voltage that has more than one state. The states of the output voltage of the power supply include a first state and a second state. The radio transmitter apparatus has a power amplifier connected to the power supply. The output of the power amplifier is coupled to the antenna. The radio transmitter also includes a control signal generator that generates a control signal. The control signal has a first condition when the output voltage of the power supply is in its first state, and has a second condition when the output voltage of the power supply is in its second state. Finally, the radio transmitter includes an impedance switching device that connects a load impedance to the output of the power amplifier only when the control signal is in its first condition.

The above, and other objects, features and advantages of the present invention will become apparent in the following detailed description of an illustrative embodiment to be taken in conjunction with the accompanying drawings, in which like reference numerals are used to identify the same or similar parts in the several views.

BRIEF DESCRIPTION OF THE DRAWINGS

FIG. 4 is a schematic diagram showing part of a modified embodiment of the radio transmitter apparatus according to the present invention in which the load impedance is switched when a diode is turned on.

DETAILED DESCRIPTION OF THE PREFERRED EMBODIMENTS

Figure 1A:
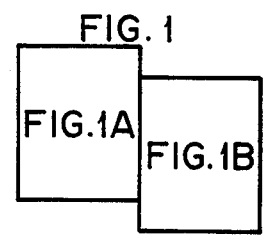
FIGS. 1A & 1B show a schematic diagram of the transmission output stage of a mobile telephone system such as a so-called cellular phone system according to the prior art.
Figure 1A:
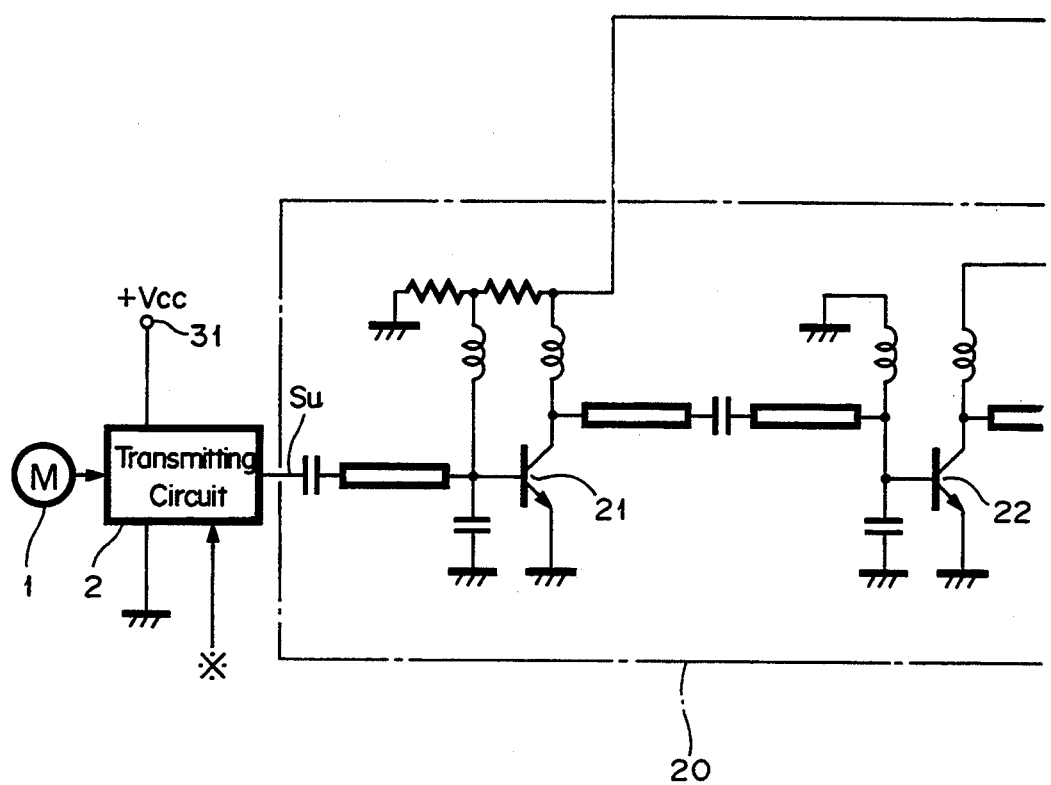
Figure 1A:
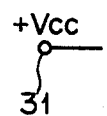
Figure 1B:
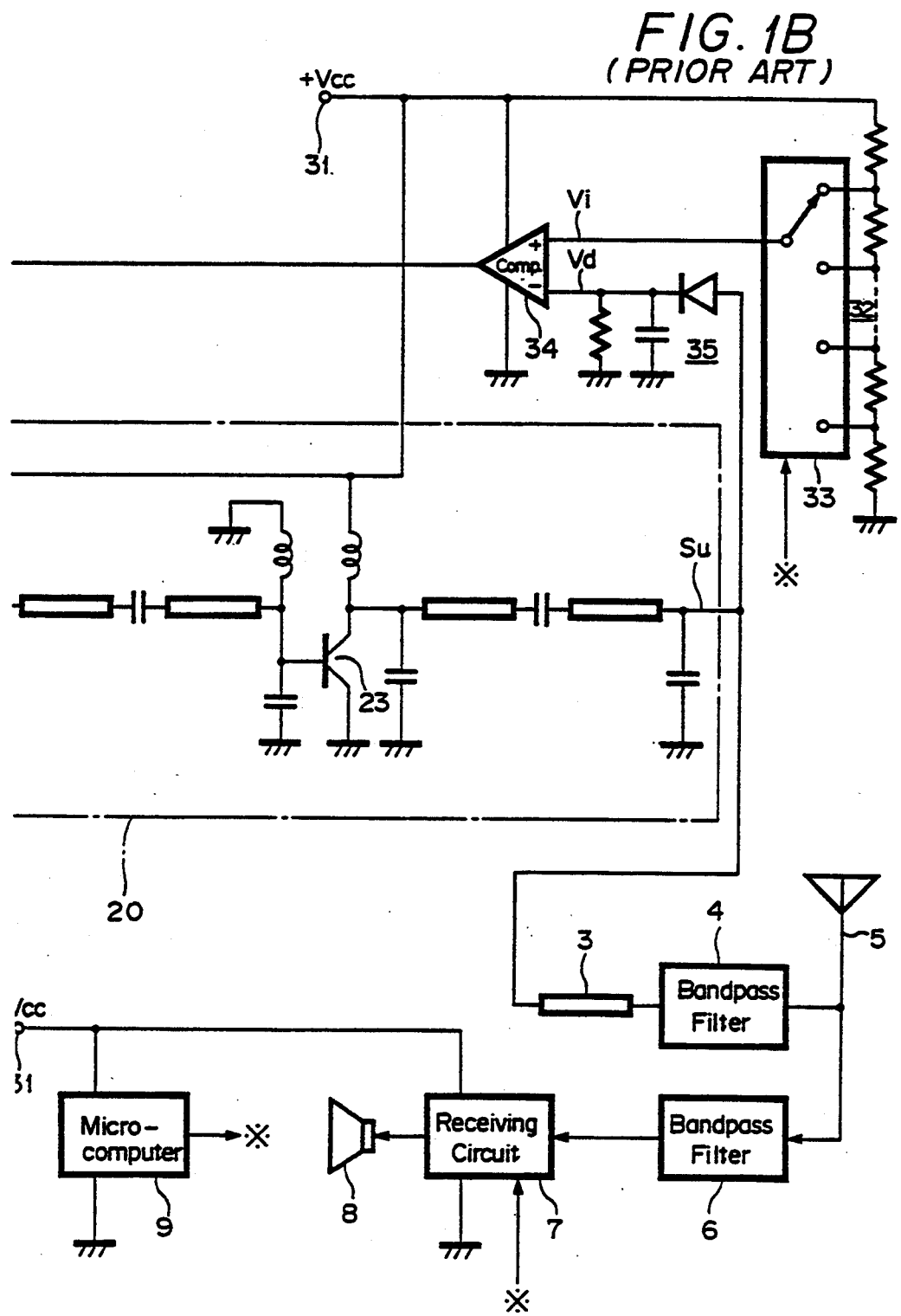
Figure 2:
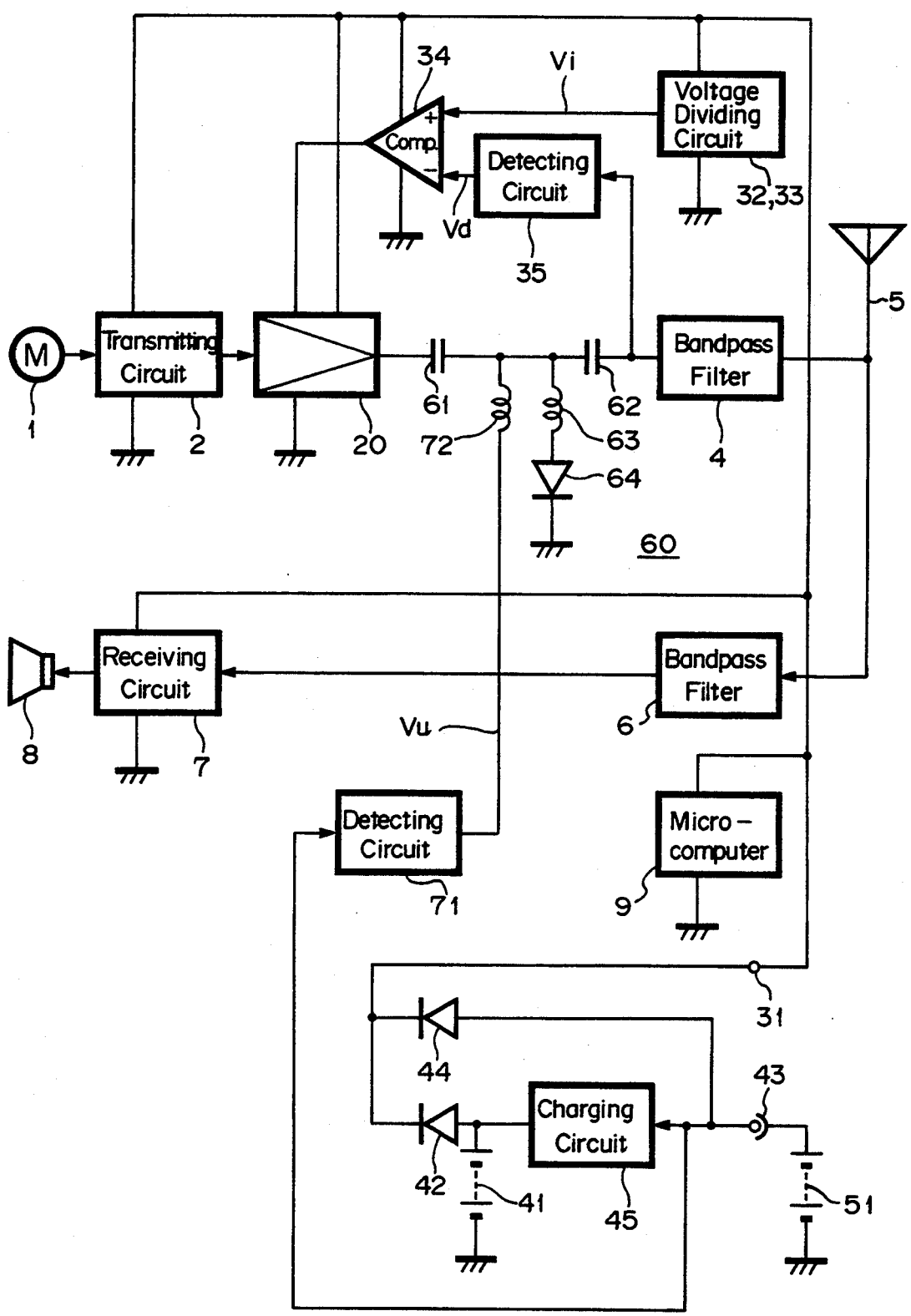
FIG. 2 is a schematic diagram showing an embodiment of a radio transmitter apparatus according to the present invention.

An embodiment of the radio transmitter apparatus according to the present invention will hereinafter be described with reference to the drawings. In FIG. 2, which shows an overall arrangement of the embodiment, like parts corresponding to those of FIG. 1 are marked with the same reference numbers and therefore will not be described in detail.

In FIG. 2, reference numeral 41 designates the built-in battery. The battery 41 is a rechargeable battery, for example, a nickel-cadmium battery. The battery 41 is connected to the terminal 31 through a reverse current blocking diode 42. Reference numeral 43 designates an external power terminal. The terminal 43 is connected to the terminal 31 via a reverse current blocking diode 44 and is also connected to the battery 41 through a charging circuit 45.

When this mobile station is installed in an automobile, as shown in FIG. 2, the battery 51 of the automobile is connected to the terminal 43.

Reference numeral 60 generally designates a variable impedance circuit, wherein capacitors 61 and 62 are connected in series with the transmission line between the transistor 23 of the final stage of the power amplifier 20 and the bandpass filter 4. An inductor 63 and a switching diode 64 are connected in series between the junction of the capacitors 61 and 62 and ground.

Further, the input of a detecting circuit 71 for detecting the voltage of the battery 51 is connected to the terminal 43. The detecting circuit 71 derives a detected voltage Vu which has a "1" state when the battery 51 is connected to the terminal 43 and which has a "0" state when the battery 51 is not connected to the terminal 43. The detected voltage Vu is supplied through a high frequency choke 72 to the junction of the elements 61 to 63.

According to the above arrangement, when the mobile station is not mounted in the automobile, the battery 51 is not connected, and voltage of the built-in battery 41 is supplied through the diode 42 and the terminal 31 to the respective portions of the mobile station as their operating voltage.

Additionally, since the voltage Vu="0", the diode 64 is in its off state, which effectively disconnects the inductor 63 from the amplifier 20.

Accordingly, with the appropriate input impedance of the bandpass filter, 4 the load impedance of the power amplifier 20 will be, for example, 50 Ω so that the transmitter operates at maximum efficiency. Thus when the mobile station is driven by the built-in battery 41, the transmitter can operate at maximum efficiency.

On the other hand, when the mobile station is mounted in the automobile, the car battery 51 is connected to the terminal 43. The voltage of the battery 51 is supplied through the diode 44 and the terminal 31 to the respective portions in the mobile station as their operating voltage. Also, the car battery 51 charges the built-in battery 41 through the charging circuit 45.

Additionally, since the voltage Vu="1", the diode 64 is in its on state, which effectively connects the inductor 63 to the amplifier 20.

Accordingly, if the inductor 63 has an appropriate value, then the load impedance on the power amplifier 20 will be the optimum value required to enable the transmitter to operate at maximum efficiency. Thus, when the mobile station is driven by the battery 51 of the automobile, the transmitter can also operate at maximum efficiency.

As described above, according to the present invention, the variable impedance circuit 60 and the detecting circuit 71 switch the load impedance on the power amplifier 20 to the optimum value when the power source is either the built-in battery 41 or the battery 51 of the automobile. Thus, even when the mobile station is powered by the built-in battery 41, the transmission is carried out at the highest efficiency so that the service life of the built-in battery 41, i.e., the available telephone communication time, is maximized.

Figure 3:
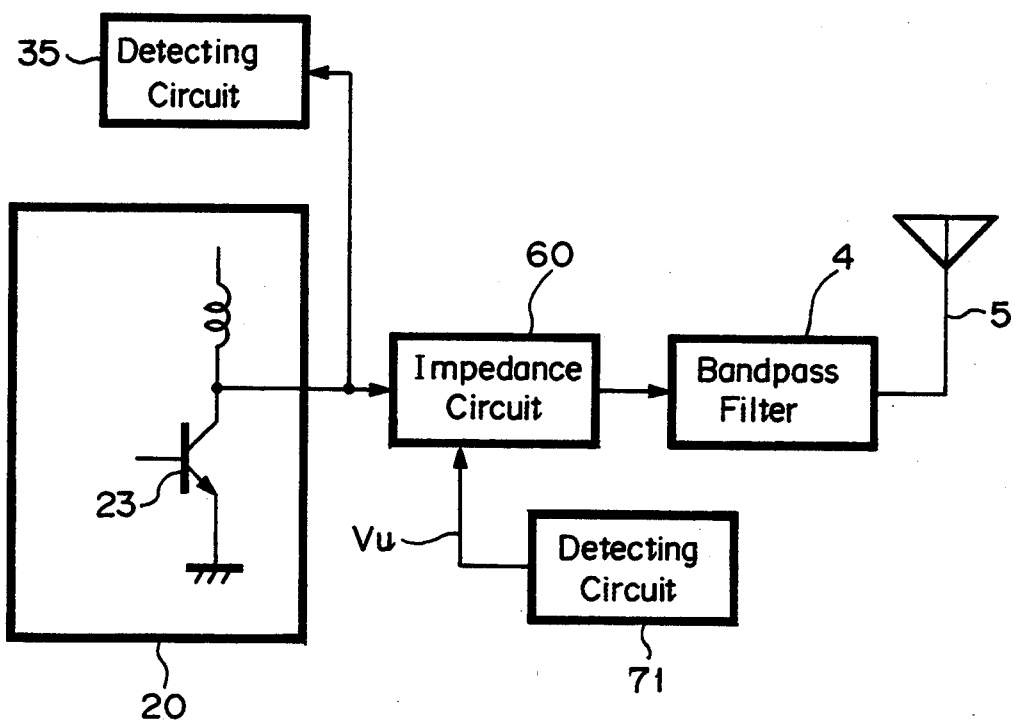
FIG. 3 is a schematic diagram showing a part of a modified embodiment of the radio transmitter apparatus shown in FIG. 2 in which the connected position of an impedance circuit is changed.
Figure 4:
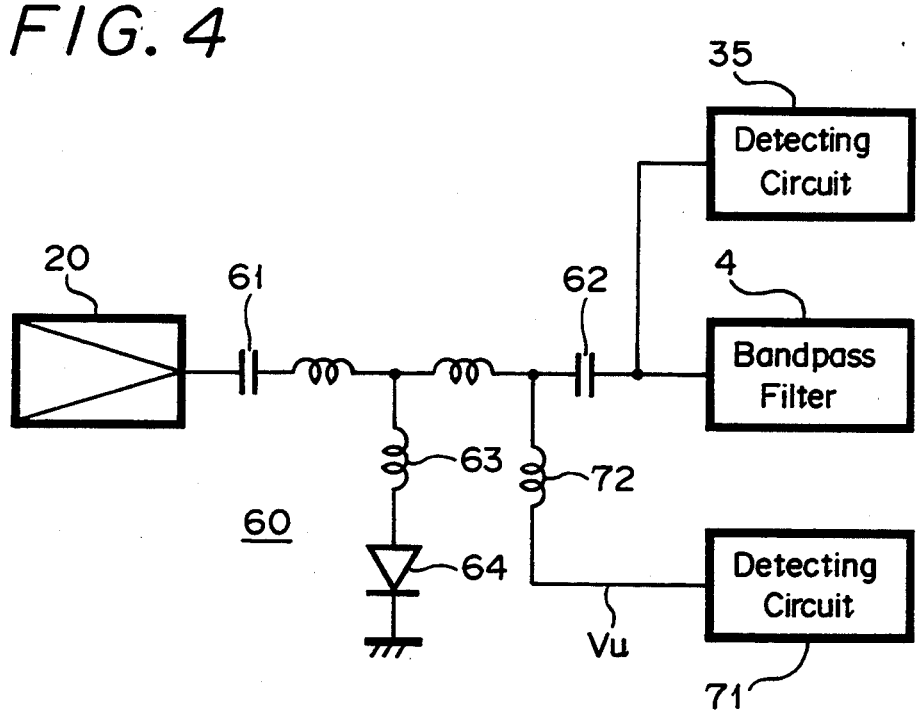

FIG. 3 shows a part of the radio transmitter apparatus of the present invention in which the impedance circuit 60 is connected into the circuit differently, and FIG. 4 shows a part of the radio transmitter apparatus in which the impedance of the impedance circuit 60 is switched by utilizing the fact that the diode 64 has a capacitance when it is in its off state.

Figure 5:
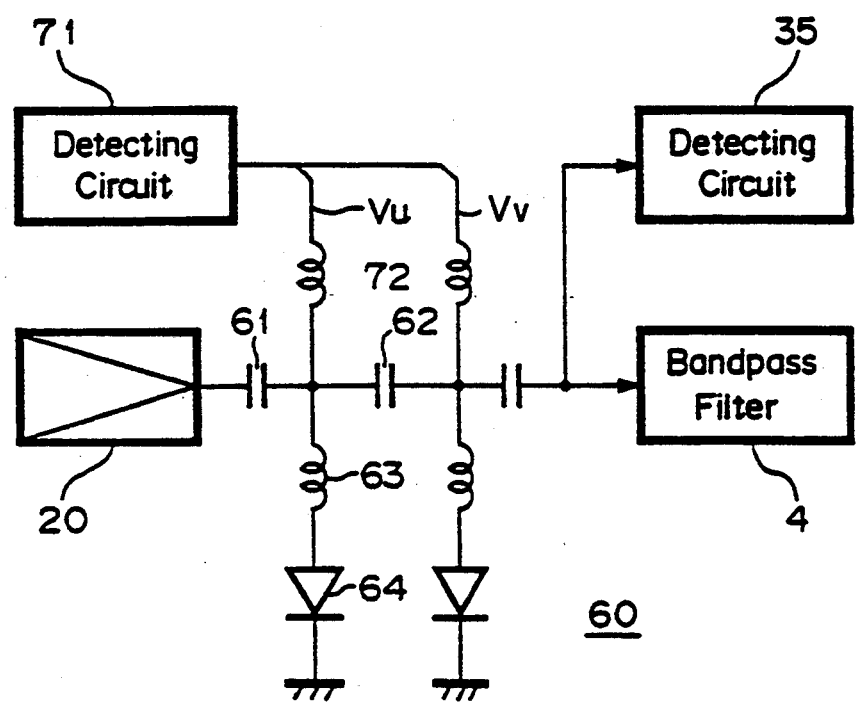
FIG. 5 is a schematic diagram showing a part of another embodiment of the radio transmitter apparatus according to the present invention in which load impedance circuits are connected in a multi-stage configuration.

FIG. 5 shows a part of another embodiment of the radio transmitter apparatus according to the present invention in which the impedance circuit 60 is connected in a multi-stage configuration fashion. In this embodiment, the detecting circuit 71 derives the first detected voltage Vu and a second detected voltage Vv in response to the voltage at the terminal 43, and on the basis of the combinations of the detected voltages Vu and Vv, the load impedance of the power amplifier 20 is switched in three steps. Accordingly, in that case, when the mobile station is driven by a power source other than the built-in battery 41 and the car battery 51, the transmitter can operate at the highest efficiency.

Alternatively, the voltage at the terminal 31 is detected by the detecting circuit 71 in three steps so that, as the voltage of the built-in battery 41 or of the car battery 51 falls, the transmitter can operate at high efficiency regardless of the voltage of the battery by switching the load impedance of the power amplifier 20.

Incidentally, in the above arrangement, when the voltage Vi is switched by the microcomputer 9, the impedance circuit 60 can also be switched in multiple steps.

As described above, according to the present invention, the variable impedance circuit 60 and the detecting circuit 71 switch the load impedance of the power amplifier 20 to the optimum value when the power source is the built-in battery 41 or the battery 51 of the automobile. Thus, even when the mobile station is driven by using the built-in battery 41, the transmitter operates at the highest efficiency so that the service life of the built-in battery 41, i.e., the telephone communication time, can be maximized.

Having described the preferred embodiments of the invention with reference to the accompanying drawings, it is to be understood that the invention is not limited to those precise embodiments and that various changes and modifications thereof could be effected by one skilled in the art without departing from the spirit or scope of the novel concepts of the invention as defined in the appended claims.

I claim as my invention:

1. A radio transmitter apparatus for transmitting a signal to an antenna, the radio transmitter apparatus comprising:
   (a) a power source including one of, alternatively, either a rechargeable battery or a detachable external power supply, the rechargeable battery having a lower voltage than the external power supply;
   (b) a power amplifier connected to the power source;
   (c) a variable impedance circuit connected between the power amplifier and the antenna; and
   (d) a detecting circuit means for detecting whether the power amplifier is connected to the rechargeable battery or to the external power supply by detecting a voltage from the power source and controlling the variable impedance circuit to switch a load impedance of the power amplifier to a first, optimum value when the detecting circuit detects that the power source is the rechargeable battery, so that the load impedance to the transmitter maximizes the efficiency of the radio transmitter while preserving a minimum necessary power output in order to extend a battery life of the rechargeable battery of the transmitter.

2. A radio transmitter apparatus according to claim 1, wherein the detecting circuit, when it detects that the power source is the external power supply, switches the variable impedance to a second value, which is different than the first value, so that the load impedance to the transmitter enables the radio transmitter to operate at a maximum efficiency without regard to power consumption of the power source.

3. A radio transmitter apparatus according to claim 1, wherein the radio transmitter is housed in a casing and the rechargeable battery is housed within the casing.

4. A radio transmitter apparatus for transmitting a signal to an antenna, the radio transmitter apparatus comprising:
   (a) a power source including one of, alternatively, either a rechargeable battery or a detachable external power supply, the rechargeable battery having a lower voltage than the external power supply;
   (b) a power amplifier connected to the power source;
   (c) a variable impedance circuit including a first capacitor and a second capacitor connected in series between the lower amplifier and the antenna and a first coil and a switching diode connected in series between a junction of the first and second capacitors and ground; and
   (d) a detecting circuit, connected to the junction of the first and second capacitors of the variable impedance circuit by a second coil, for detecting whether the power amplifier is connected to the rechargeable battery or to the external power supply by detecting a voltage from the power source, said detecting circuit producing a first voltage state when the detecting circuit detects that the power amplifier is connected to the rechargeable battery, causing the switching diode to be off, said detecting circuit producing a second voltage state when the detecting circuit detects that the power amplifier is connected to the external power supply, causing the switching diode to be on, whereby said variable impedance circuit is controlled to switch a load impedance of the power amplifier to a first, optimum value, based on the value of the first coil, when the detecting circuit detects that the power source is the rechargeable battery, so that the load impedance to the transmitter maximizes the efficiency of the radio transmitter while preserving a minimum necessary power output in order to extend a battery life of the rechargeable battery of the transmitter.

* * * * *